(12) United States Patent
Yamazaki et al.

(10) Patent No.: US 11,361,966 B2
(45) Date of Patent: Jun. 14, 2022

(54) METHOD OF MANUFACTURING SEMICONDUCTOR DEVICE

(71) Applicant: KIOXIA CORPORATION, Tokyo (JP)

(72) Inventors: Soichi Yamazaki, Yokkaichi Mie (JP); Kazuhito Furumoto, Yokkaichi Mie (JP); Kosuke Horibe, Yokkaichi Mie (JP); Keisuke Kikutani, Yokkaichi Mie (JP); Atsuko Sakata, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 297 days.

(21) Appl. No.: 16/803,194

(22) Filed: Feb. 27, 2020

(65) Prior Publication Data

US 2021/0020439 A1 Jan. 21, 2021

(30) Foreign Application Priority Data

Jul. 18, 2019 (JP) .............................. JP2019-132915

(51) Int. Cl.
*H01L 21/033* (2006.01)
*H01L 21/3213* (2006.01)
*H01L 21/311* (2006.01)
*H01L 27/11556* (2017.01)
*H01L 27/11582* (2017.01)

(52) U.S. Cl.
CPC .... *H01L 21/0332* (2013.01); *H01L 21/31116* (2013.01); *H01L 21/31144* (2013.01); *H01L 21/32136* (2013.01); *H01L 21/32139* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 6,083,841 A | 7/2000 | Yano et al. |
| 8,614,143 B2 | 12/2013 | Kulkarni et al. |
| 2018/0261466 A1 | 9/2018 | Yamazaki et al. |

*Primary Examiner* — Roberts P Culbert
(74) *Attorney, Agent, or Firm* — Foley & Lardner LLP

(57) ABSTRACT

According to one embodiment, a method of manufacturing a semiconductor device includes forming a first film on a substrate. The method further includes forming a second film on the first film. The second film includes fluoride of a first metal element having a first boiling point of 800° C. or higher and fluoride of a second metal element having a second boiling point of 800° C. or higher. The second metal element is different from the first metal element. The method further includes etching the first film using the second film as an etching mask and etching gas that includes fluorine.

14 Claims, 11 Drawing Sheets 24.8%Zr

100nm 34.2%Zr

100nm 42.9%Zr

100nm 56.4%Zr

100nm 60.7%Zr

100nm 63.4%Zr

100nm 69.4%Zr

100nm

METHOD OF MANUFACTURING SEMICONDUCTOR DEVICE

CROSS-REFERENCE TO RELATED APPLICATION

This application is based upon and claims the benefit of priority from Japanese Patent Application No. 2019-132915, filed Jul. 18, 2019, the entire contents of which are incorporated herein by reference.

FIELD

Embodiments described herein relate generally to a method of manufacturing a semiconductor device.

BACKGROUND

In using a metal mask as an etching mask, it matters what kind of metal improves performance of the metal mask.

Examples of related art include JP-A-2018-152418.

DETAILED DESCRIPTION

Figure 1:
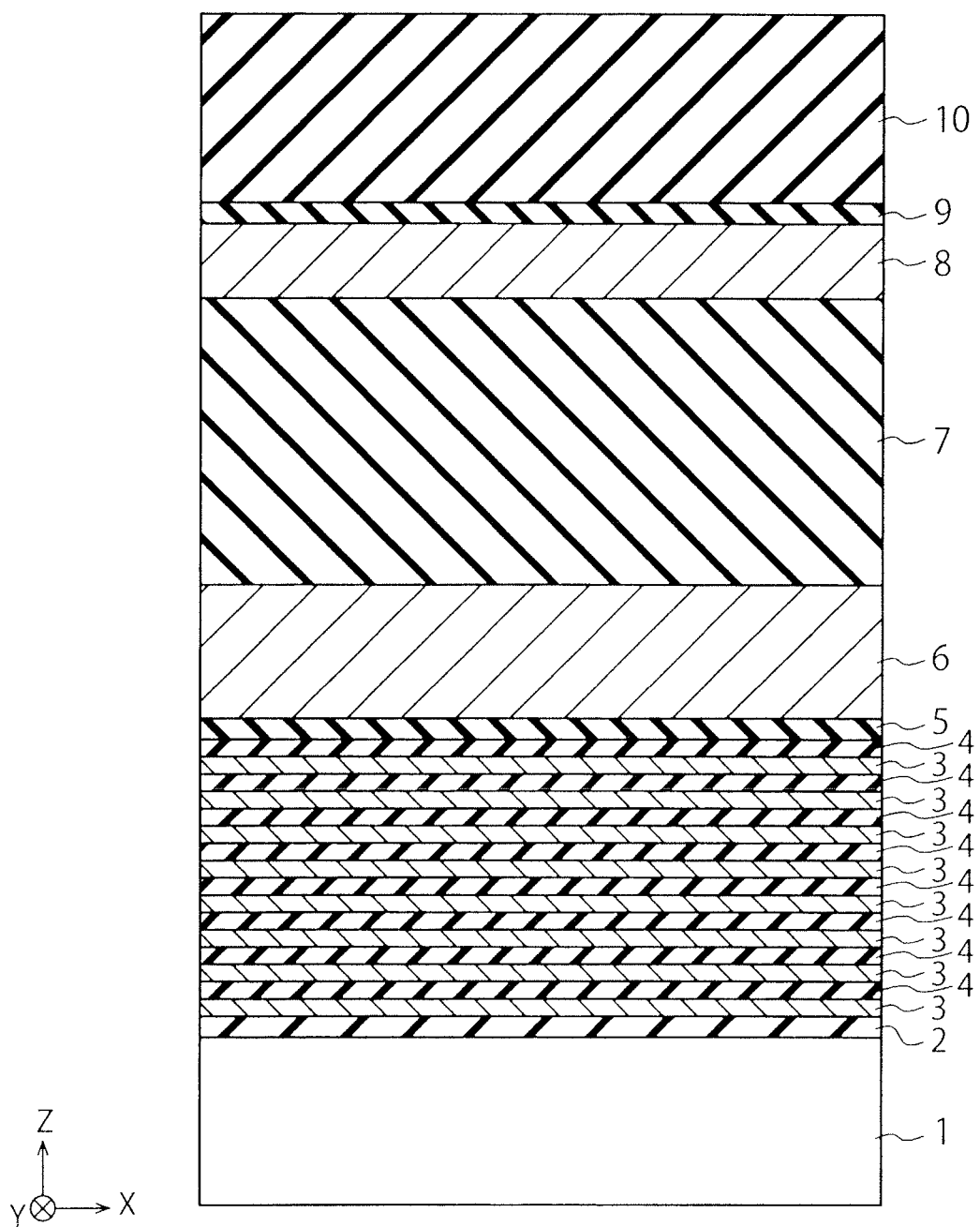
FIG. 1 is a cross-sectional view (1/5) of a semiconductor device, illustrating a method of manufacturing the semiconductor device according to a first embodiment.

Embodiments provide a method of manufacturing a semiconductor device that can improve performance of a metal mask used as an etching mask.

In general, according to one embodiment, a method of manufacturing a semiconductor device includes forming a first film on a substrate. The method further includes forming a second film on the first film. The second film includes fluoride of a first metal element having a first boiling point of 800° C. or higher and fluoride of a second metal element having a second boiling point of 800° C. or higher. The second metal element is different from the first metal element. The method further includes etching the first film using the second film as an etching mask and etching gas that includes fluorine.

Hereinafter, embodiments of the present disclosure will be described with reference to the drawings. In FIGS. 1 to 17, the same or similar components are denoted with identical reference numerals and signs and will not be elaborated repeatedly.

(First Embodiment) FIGS. 1 to 5B are cross-sectional views of a semiconductor device, illustrating a method of manufacturing the semiconductor device according to a first embodiment. The semiconductor device according to the first embodiment is, for example, a three-dimensional memory.

First, a lower insulating film 2 is formed on a substrate 1, and a plurality of electrode layers 3 and a plurality of insulating layers 4 alternately stacked on top of one another on the lower insulating film 2 (see FIG. 1). Next, an upper insulating film 5 is formed on a stacked film including the electrode layers 3 and the insulating layers 4, and a metal mask layer 6, an insulator mask layer 7, a semiconductor mask layer 8, an antireflection film 9, and a resist film 10 are formed in sequence on the upper insulating film 5 (see FIG. 1).

The substrate 1 is, for example, a semiconductor substrate such as a silicon (Si) substrate. In FIG. 1, an X-direction and a Y-direction are parallel to a surface of the substrate 1 and perpendicular to each other, and a Z-direction is perpendicular to the surface of the substrate 1. In the following discussion, a +Z-direction refers to an upward direction whereas a −Z-direct ion refers to a downward direction. The −Z-direction may or may not coincide with a direction of gravity.

The lower insulating film 2 is, for example, a silicon oxide film (such as an $SiO_2$ film). The lower insulating film 2 may be formed on another layer on the substrate 1. Examples of the electrode layers 3 include metal layers such as tungsten (W) layers. The electrode layers 3 according to this embodiment function as, for example, word lines of memory cells that constitute the three-dimensional memory. Examples of the insulating layers 4 include an $SiO_2$ film. The upper insulating film 5 is, for example, an $SiO_2$ film. The lower insulating film 2, the electrode layers 3, the insulating layers 4, and the upper insulating film 5 are an example of the first film.

Examples of the metal mask layer 6 include a metal layer containing a metal element fluoride of which has a boiling point of 800° C. or higher and a metal element chloride of which has a boiling point of 500° C. or less. As such a metal element, the metal mask layer 6 according to this embodiment contains two or more kinds of metal elements different from each other. The two or more kinds of metal elements are, for example, aluminum (Al) and zirconium (Zr). The boiling point of fluoride of Al and the boiling point of fluoride of Zr are 800° C. or higher at normal pressure, and the boiling point of chloride of Al and the boiling point of chloride of Zr are 500° C. or less at normal pressure. The metal mask layer 6 according to this embodiment is, for example, an AlZr alloy layer containing Al and Zr and has a film thickness of approximately 400 nm. The film thickness of the metal mask layer 6 is, for example, a fifth to a fourth of a film thickness of the above-described stacked film. The metal mask layer 6 may be formed on another layer on the upper insulating film 5. The metal mask layer 6 is an example of the second film. Other examples of the above-described metal elements include bismuth (Bi), gallium (Ga), and hafnium (Hf).

The metal mask layer 6 according to this embodiment contains the first metal element and the second metal element. A boiling point of fluoride of the second metal element is lower than a boiling point of fluoride of the first metal element, and a boiling point of chloride of the second metal element is higher than a boiling point of chloride of the first metal, element. Examples of the first metal element and the second metal element include Al and Zr described above. Specifically, a fluoride of Al is $AlF_3$ and has a boiling point of 1280° C. A fluoride of Zr is $ZrF_4$ and has a boiling point of 908° C. A chloride of Al is $AlCl_3$ and has a boiling point of 120° C. chloride of Zr is $ZrCl_4$ and has a boiling point of 334° C. The metal mask layer 6 may further contain other elements, such as nitrogen (N) and oxygen (O).

According to this embodiment, a composition ratio of the second metal element to the first and second metal elements in the metal mask layer 6 is 25% or higher and 63% or less. When the metal mask layer 6 is an $Al_{1-X}Zr_X$ layer (X represents an integer that satisfies 0<X<1), X is desirably set at 0.25 or larger and 0.63 or less. The same applies when the metal mask layer 6 is an $Al_{1-X}Zr_XN_Y$ layer and an $Al_{1-X}Zr_XO_Y$ layer (Y represents a positive integer). The metal mask layer 6 according to this embodiment is desirably formed as an amorphous layer containing Al and Zr. The metal mask layer 6 according to this embodiment will be described in more detail later.

The insulator mask layer 7 is, for example, an insulating film such as an $SiO_2$ film. The semiconductor mask layer 8 is, for example, a semiconductor layer such as an amorphous Si layer. The antireflection film 9 is, for example, an $SiO_2$ film and also referred to as bottom anti-reflection coating (BARC). The resist film 10 may be of a positive type or a negative type.

Figure 2:
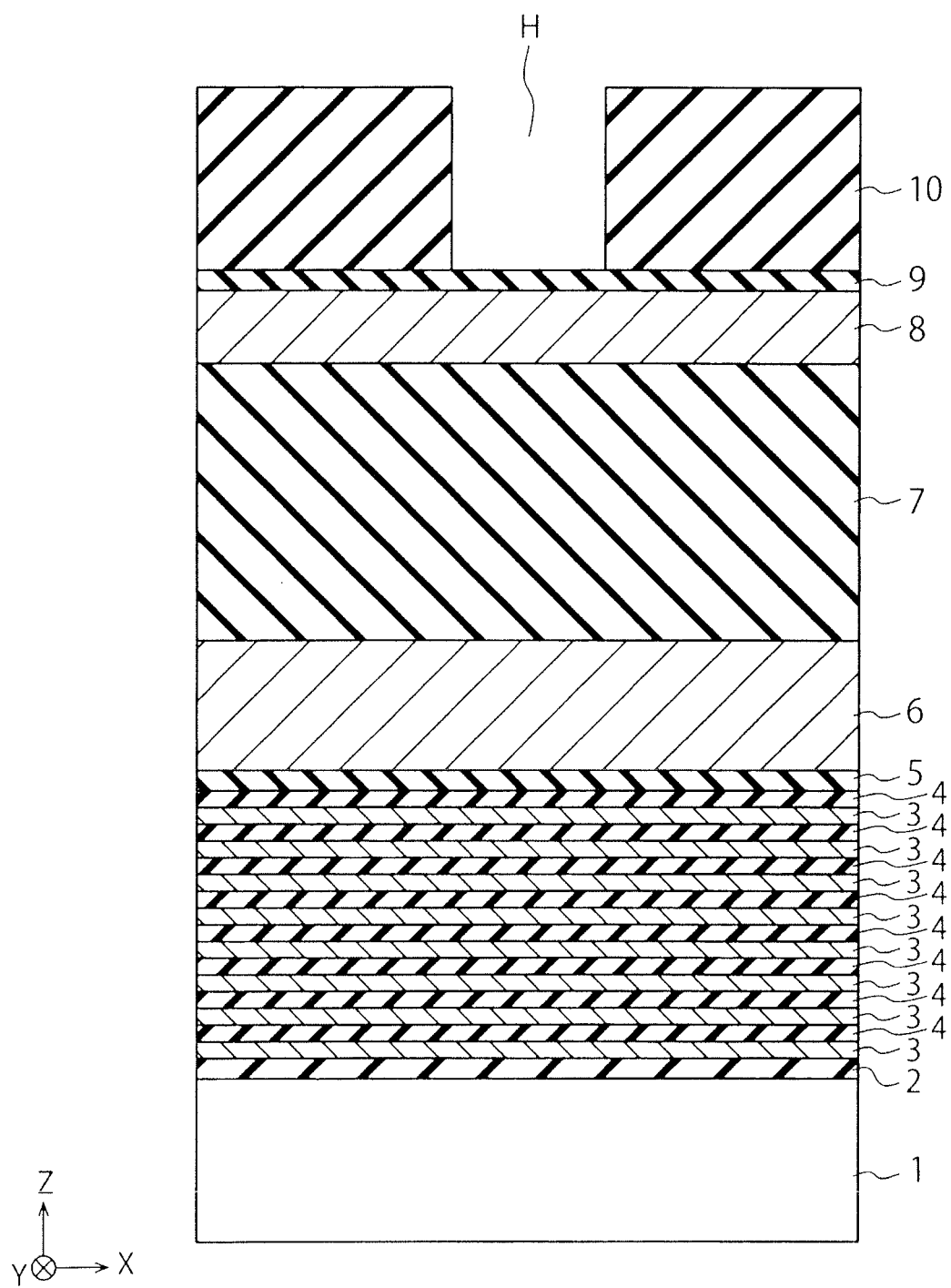
FIG. 2 is a cross-sectional view (2/5) of the semiconductor device, illustrating the method of manufacturing the semiconductor device according to the first embodiment.

Next, the resist film 10 is patterned by lithography (see FIG. 2). As a result, an opening H is formed in the resist film 10. The opening H according to this embodiment has a circular plan-view shape, for example, but may have other plan-view shapes.

Figure 3:
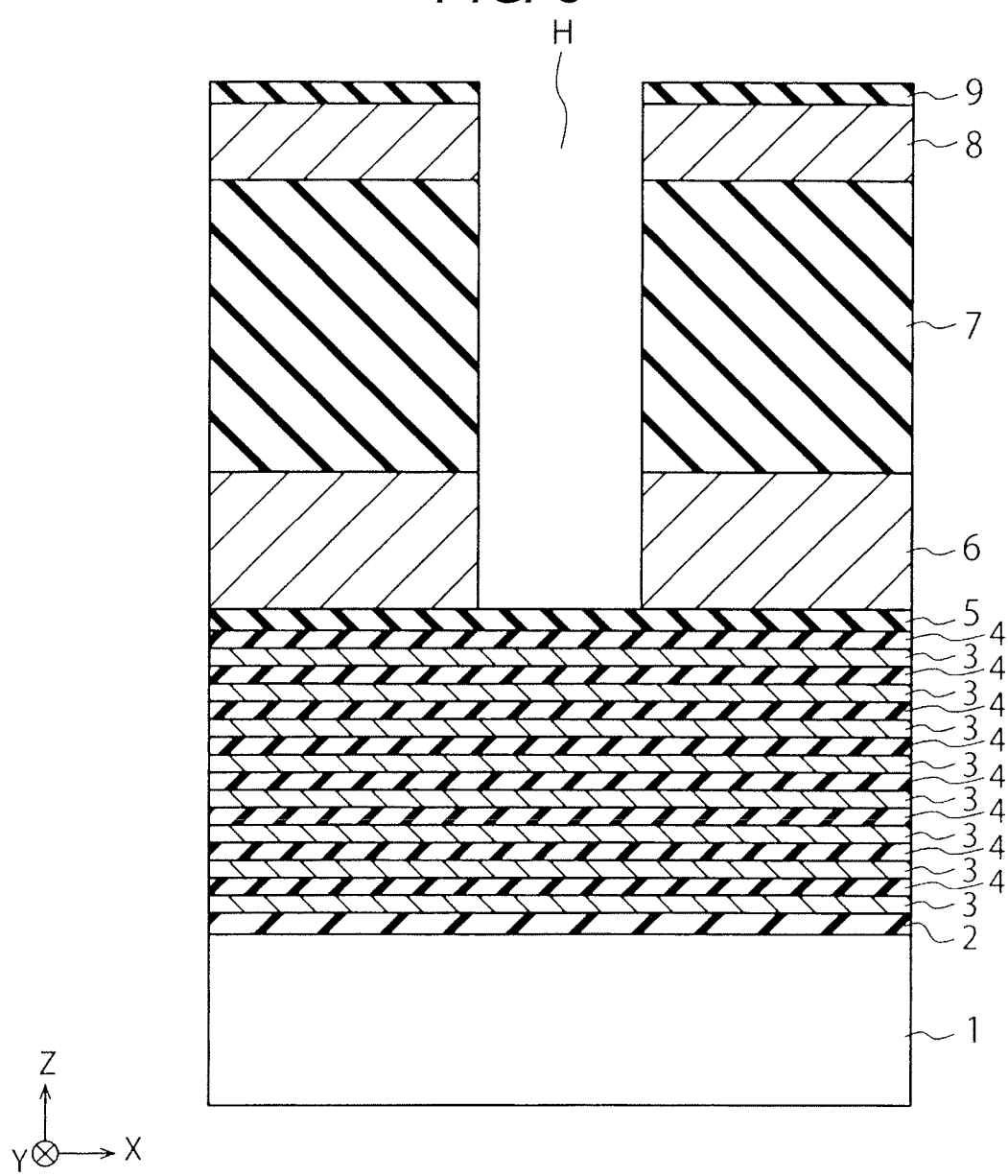
FIG. 3 is a cross-sectional view (3/5) of the semiconductor device, illustrating the method of manufacturing the semiconductor device according to the first embodiment.

Next, reactive ion etching (RIE) is performed using the resist film 10 as an etching mask to etch the antireflection film 9, the semiconductor mask layer 8, the insulator mask layer 7, and the metal mask layer 6 (see FIG. 3). As a result, the antireflection film 9, the semiconductor mask layer 8, the insulator mask layer 7, and the metal mask layer 6 at the bottom of the opening H are removed to expose an upper surface of the upper insulating film 5 in the opening H.

The metal mask layer 6 according to this embodiment is etched by the RIE using chlorine-based gas, which is a gas containing chlorine (Cl). Examples of the chlorine-based gas include $Cl_2$ gas and chlorine compound gas. The metal mask layer 6 according to this embodiment may be etched using mixed gas including chlorine-based gas and other gas (such as oxygen gas).

Figure 4A:
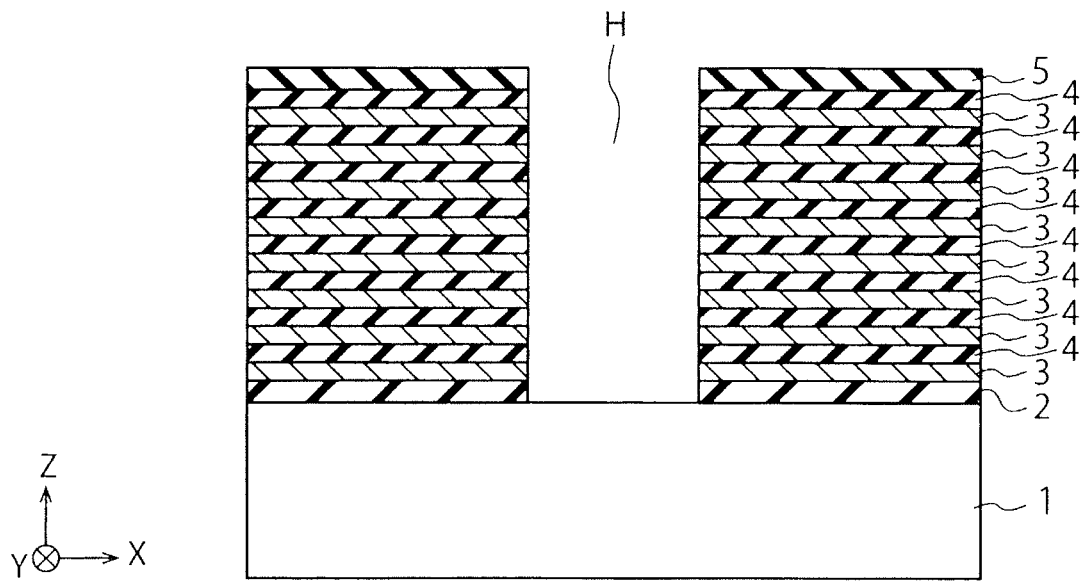
FIGS. 4A and 4B are cross-sectional views (4/5) of the semiconductor device, illustrating the method of manufacturing the semiconductor device according to the first embodiment.

Next, the RIE is performed using the semiconductor mask layer 8, the insulator mask layer 7, and the metal mask layer 6 as etching masks to etch the upper insulating film 5, the stacked film including the plurality of electrode layers 3 and the plurality of insulating layers 4, and the lower insulating film 2 (see FIG. 4A). For example, the stacked film is etched by the RIE using the metal mask layer 6 as an etching mask. As a result, the upper insulating film 5, the stacked film, and the lower insulating film 2 at the bottom of the opening H are removed to expose an upper surface of the substrate 1 in the opening H.

The stacked film according to this embodiment includes a plurality of W layers and a plurality of $SiO_2$ films and is etched by the RIE using fluorine-based gas, which is a gas containing fluorine (F). Examples of the fluorine-based gas include $F_2$ gas and fluorine compound gas. The stacked film according to this embodiment may be etched using mixed gas including fluorine-based gas and other gas (such as oxygen gas).

Figure 4B:
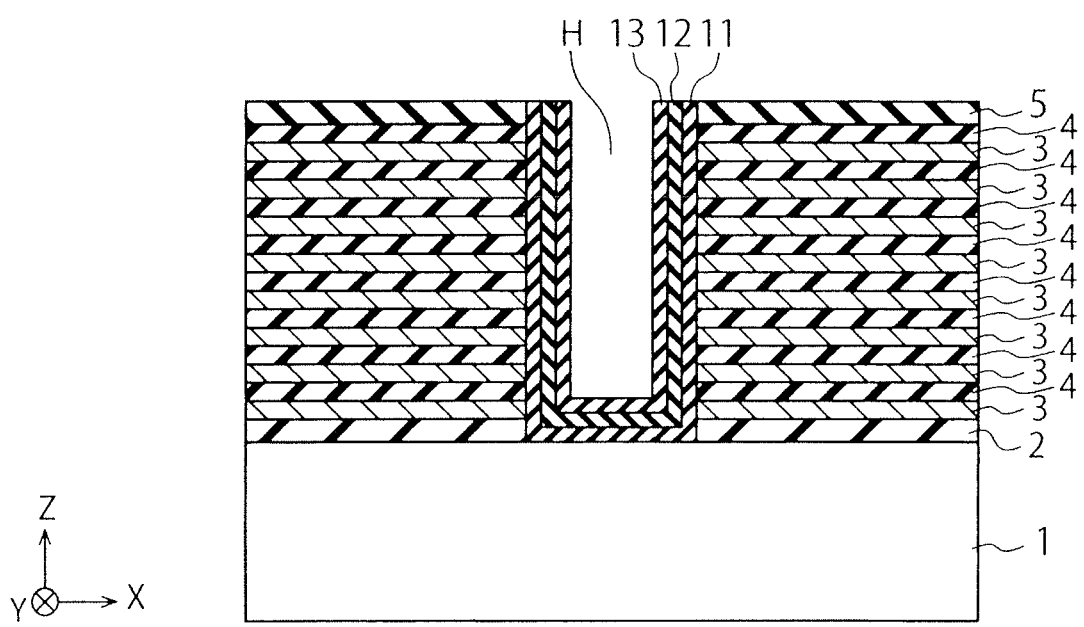

Next, after removing the metal mask layer 6, a block insulating film 11, a charge storage layer 12, and a tunnel insulating film 13 are formed in sequence on the side and the bottom of the opening H in the lower insulating film 2, the stacked film, and the upper insulating film 5 (see FIG. 4B). The block insulating film 11 is, for example, an $SiO_2$ film. The charge storage layer 12 is, for example, a silicon nitride film (an SiN film). The charge storage layer 12 may be a semiconductor layer such as a polysilicon layer. The tunnel insulating film 13 is, for example, an $SiO_2$ film.

Figure 5A:
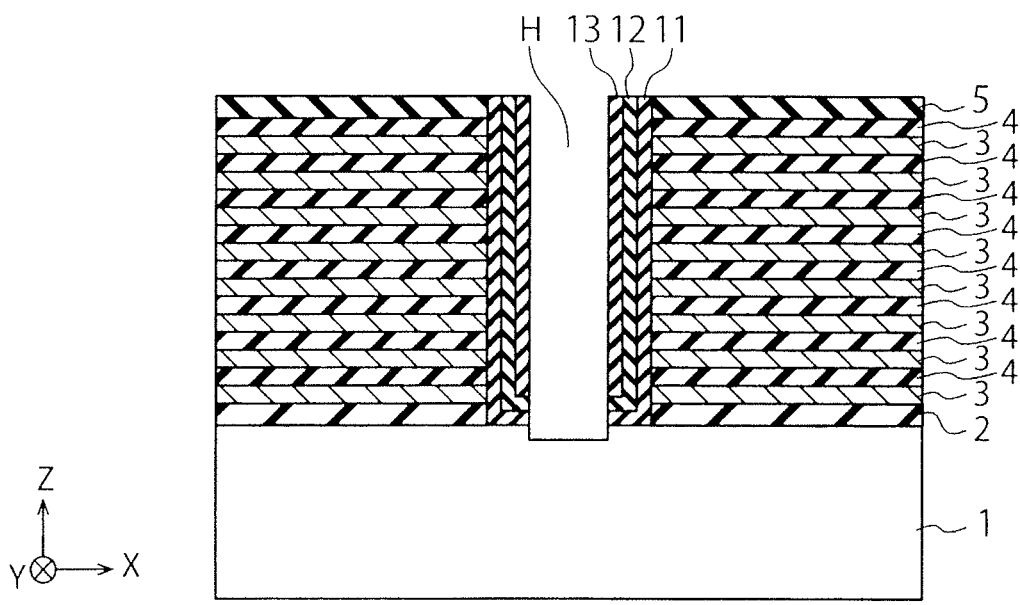
FIGS. 5A and 5B are cross-sectional views (5/5) of the semiconductor device, illustrating the method of manufacturing the semiconductor device according to the first embodiment.

Next, the tunnel insulating film 13, the charge storage layer 12, and the block insulating film 11 are etched and removed from the bottom of the opening H (see FIG. 5A). As a result, the upper surface of the substrate 1 is exposed in the opening H.

Figure 5B:
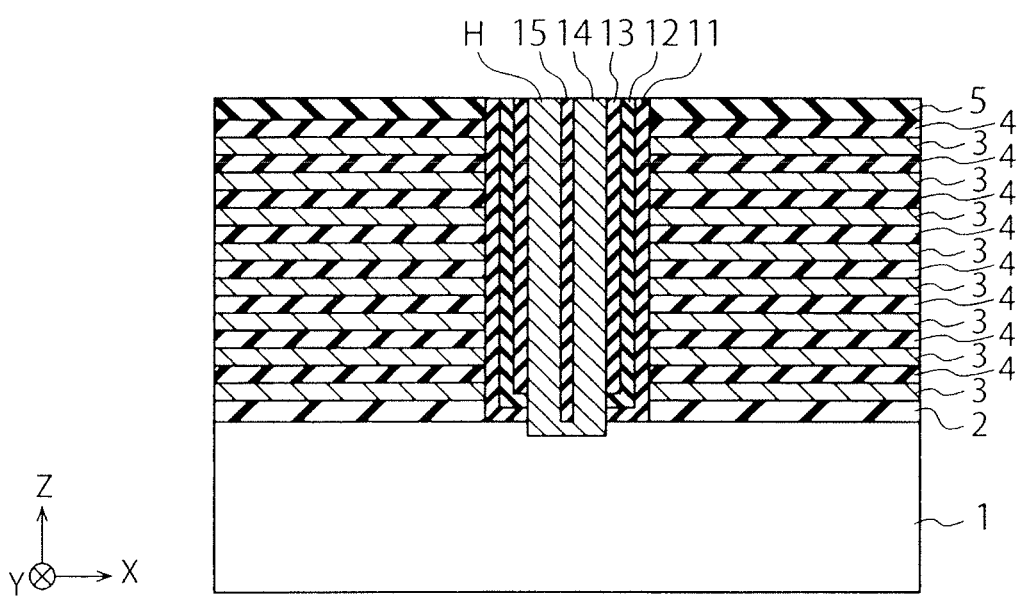

Next, a channel semiconductor layer 14 and a core insulating film 15 are formed in sequence on the side and the bottom of the opening H in the lower insulating film 2, the stacked film, and the upper insulating film 5 (see FIG. 5B). The channel semiconductor layer 14 is, for example, a polysilicon layer. The core insulating film 15 is, for example, an $SiO_2$ film. Thus, the plurality of memory cells are formed in the opening H.

Thereafter, various plug layers, wiring layers, and inter-layer insulating films, for example, are formed on the substrate 1. In this manner, the semiconductor device according to this embodiment is manufactured.

Referring to FIGS. 1 to 5B, details of the metal mask layer 6 according to this embodiment will be described below.

According to this embodiment, because the stacked film including the plurality of electrode layers 3 and the plurality of insulating layers 4 is thick, and because the electrode layers 3 are metal layers, it is difficult to etch the stacked film. Consequently, when an etching mask is liable to be easily etched, the function as the etching mask may be degraded in etching the stacked film. In view of this, according to this embodiment, the metal mask layer 6 is used as the etching mask. Since the metal mask layer 6 is generally less likely to be etched than non-metal mask layers, this embodiment enables appropriate etching of the stacked film difficult to etch. According to this embodiment, fluorine-based gas is used to etch the stacked film.

When a metal layer such as a tungsten (W) layer is etched using fluorine-based gas, an aluminum (Al) layer is used as an etching mask in some cases. The reason is that aluminum forms fluoride so stable that the aluminum layer is less likely to be removed in etching using the fluorine-based gas. $AlF_3$ having a high boiling point of 800° C. or higher also supports that aluminum forms stable fluoride.

However, the aluminum layer is a crystal layer and consequently exhibits unfavorable morphology, and the aluminum layer has low heat resistance. For such reasons, it is difficult to use the aluminum layer as a mask. In view of this, it may be considered to use an aluminum oxide film as an etching mask. However, because the aluminum oxide film is so stable that it is difficult to etch and process the aluminum oxide film for the etching mask. Generally, chlorine-based gas is used for etching to process the aluminum layer and the aluminum oxide film for the etching mask. However, the aluminum oxide film is difficult to etch using chlorine-based gas.

According to this embodiment, therefore, the metal mask layer 6, which is an AlZr alloy layer, is used as the etching mask.

Since zirconium forms stable fluoride in a manner similar to aluminum, the AlZr alloy layer is less likely to be removed in etching using fluorine-based gas. In view of this, the AlZr alloy layer is used as the etching mask, and fluorine-based gas is used as etching gas to etch the stacked film so that the stacked film, difficult to etch, can be appropriately etched. $ZrF_4$ having a high boiling point of 800° C. or higher also supports that zirconium forms stable fluoride.

Moreover, zirconium forms unstable chloride in a manner similar to aluminum so that the AlZr alloy layer is more likely to be etched by chlorine-based gas. In view of this, the AlZr alloy layer is used as the etching mask, and chlorine-based gas is used as etching gas to process the AlZr alloy layer so that the AlZr alloy layer can be easily processed for the etching mask. $AlCl_3$ and $ZrCl_4$ having low boiling points of 500° C. or less also support that aluminum and zirconium form unstable chloride.

Experiments show that with a value of X of the $Al_{1-X}Zr_X$ layer being optimized, even when heat treatment of the $Al_{1-X}Zr_X$ layer is performed at high temperature (e.g., approximately 650° C.), the $Al_{1-X}Zr_X$ layer can be maintained in an amorphous phase or a microcrystalline phase to provide the $Al_{1-X}Zr_X$ layer that exhibits favorable morphology. Moreover, the $Al_{1-X}Zr_X$ layer has higher heat resistance than the Al layer. Therefore, according to this embodiment, the $Al_{1-X}Zr_X$ layer is used as the metal mask layer 6 to improve uniformity, morphology, and heat resistance of the metal mask layer 6. Optimization of the value of X of the $Al_{1-X}Zr_X$ layer will be described in detail later.

The AlZr alloy layer is also advantageous in having high resistance to physical sputtering using argon (Ar) ions, for example. Therefore, according to this embodiment, the AlZr alloy layer is used as the metal mask layer 6 to provide an etching mask that can fully resist etching while high bias voltage is applied to the substrate 1.

FIGS. 6 to 13 are scanning electron microscope (SEM) images of the metal mask layer 6 according to the first embodiment. Specifically, FIGS. 6 to 13 illustrate the $Al_{1-X}Zr_X$ layer formed in the step illustrated in FIG. 1 and thereafter annealed at 650° C.

Figure 6:
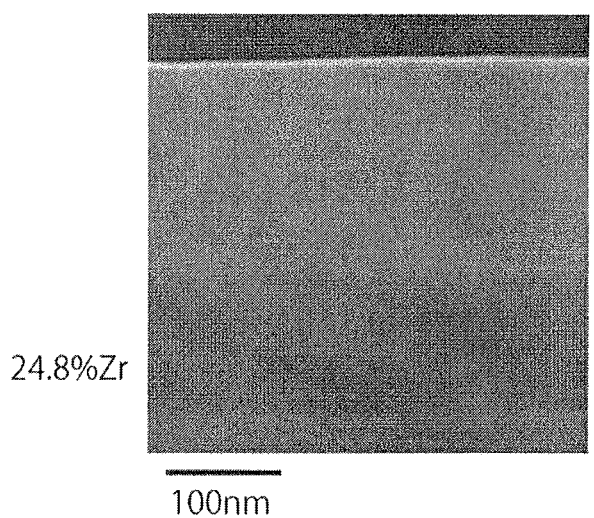
FIG. 6 is an SEM image (1/8) of a metal mask layer according to the first embodiment.
Figure 7:
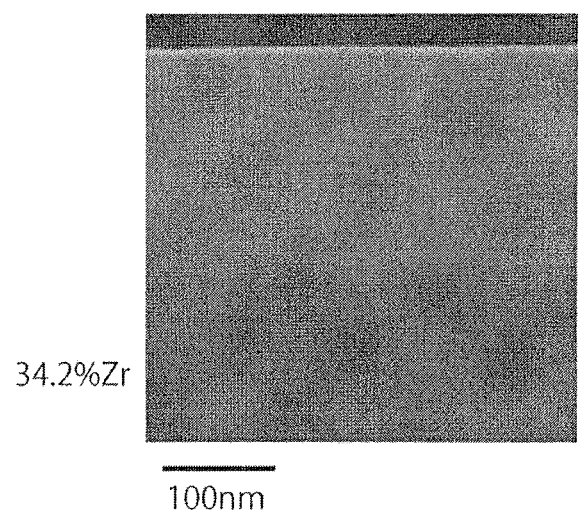
FIG. 7 is an SEM image (2/8) of the metal mask layer according to the first embodiment.
Figure 8:
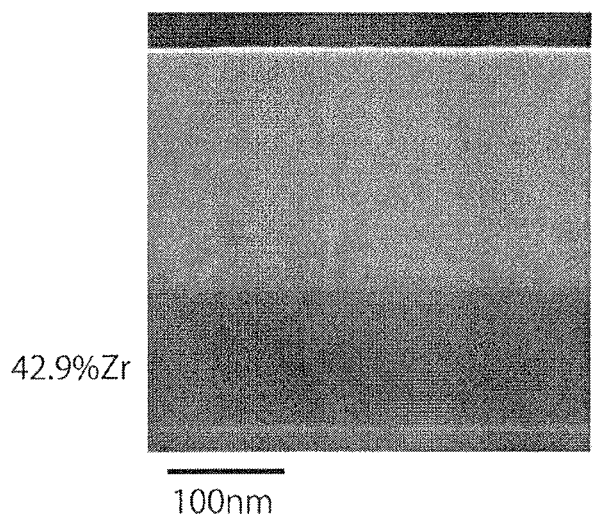
FIG. 8 is an SEM image (3/8) of the metal mask layer according to the first embodiment.
Figure 9:
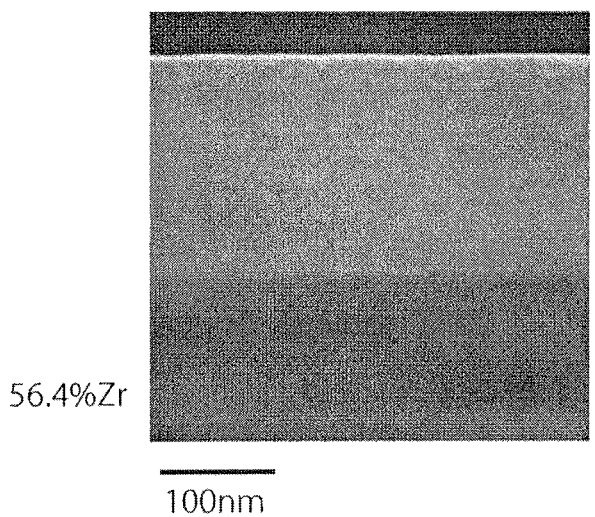
FIG. 9 is an SEM image (4/8) of the metal mask layer according to the first embodiment.
Figure 10:
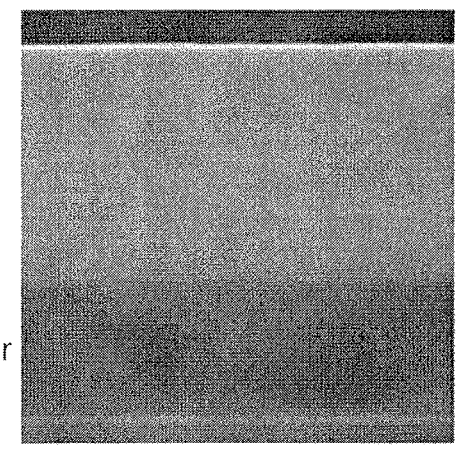
FIG. 10 is an SEM image (5/8) of the metal mask layer according to the first embodiment.
Figure 11:
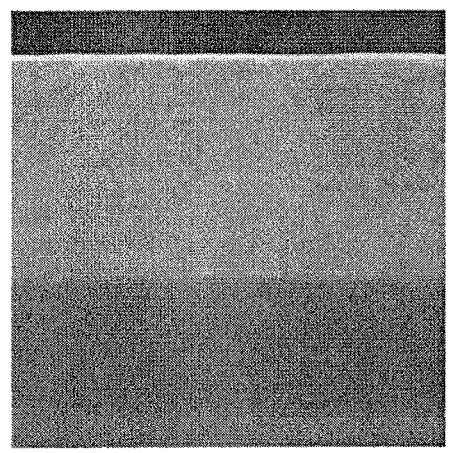
FIG. 11 is an SEM image (6/8) of the metal mask layer according to the first embodiment.
Figure 12:
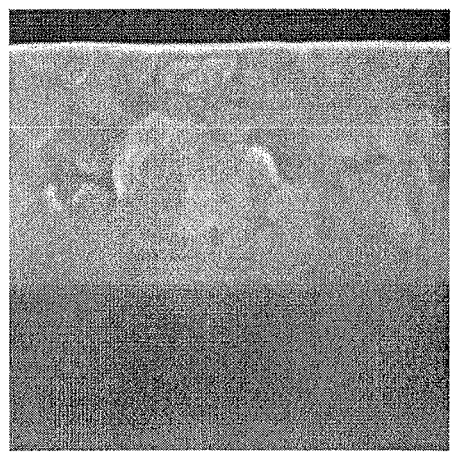
FIG. 12 is an SEM image (7/8) of the metal mask layer according to the first embodiment.
Figure 13:
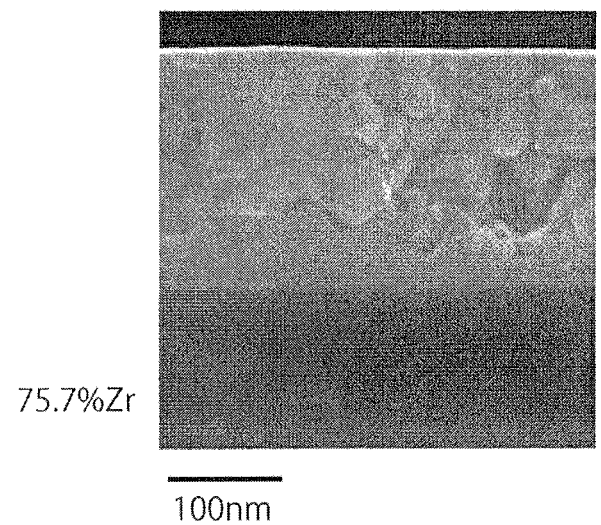
FIG. 13 is an SEM image (8/8) of the metal mask layer according to the first embodiment.

FIG. 6 is a cross-sectional image of the $Al_{1-X}Zr_X$ layer with X=0.248 (24.8%). Similarly, FIG. 7 is a cross-sectional image when X=0.342 (34.2%). FIG. 8 is when X=0.429 (42.9%). FIG. 9 is when X=0.564 (56.40). FIG. 10 is when X=0.607 (60.7%). FIG. 11 is when X=0.634 (63.4%). FIG. 12 is when X=0.694 (69.4%). FIG. 13 is when X=0.757 (75.7%). Here, the value of X indicates an actual composition ratio of Zr in the $Al_{1-X}Zr_X$ layer. Hereinafter, the value of X will be expressed in percentage.

It can be understood from these images that when the value of X is in a range from 34.2% to 60.7%, no clear grain boundaries can be found in a cross-section and a surface of the metal mask layer 6, and that the metal mask layer 6 is in an amorphous phase or a microcrystalline phase. When the value of X is 24.8% and 63.4%, crystal grains found in the cross-section of the metal mask layer 6 have minute grain diameters although an interface of a large grain diameter is found on the surface of the metal mask layer 6. Meanwhile, when the value of X is 69.4% and 75.4%, crystal grains of large grain diameters are found in the cross-section of the metal mask layer 6. It is noted that any of the images shows that the surface of the metal mask layer 6 is flat.

With the value of X being set in the range from 34.2% to 60.7%, even when the $Al_{1-X}Zr_X$ layer is annealed at high temperature (650° C. in this case), the $Al_{1-X}Zr_X$ layer can be maintained in an amorphous phase or a microcrystalline phase to provide the $Al_{1-X}Zr_X$ layer that exhibits favorable morphology. In contrast, when the value of X is 24.8% and 63.4%, an interface of a large grain diameter is found on the surface of the metal mask layer 6. Therefore, desirably, the value of X according to this embodiment is equal to or higher than 25%, which is higher than 24.8%, and equal to or less than 63%, which is less than 63.4%.

Even when the value of X is 24.8% and 63.4%, crystal grains found in the cross-section of the metal mask layer 6 have minute grain diameters so that the value of X may be slightly less than 25% and slightly higher than 63%. Furthermore, even when the value of X is 69.4% and 75.4%, the surface of the metal mask layer 6 is flat so that the value of X may be wide outside of the range from 25% to 63%.

Figure 14:
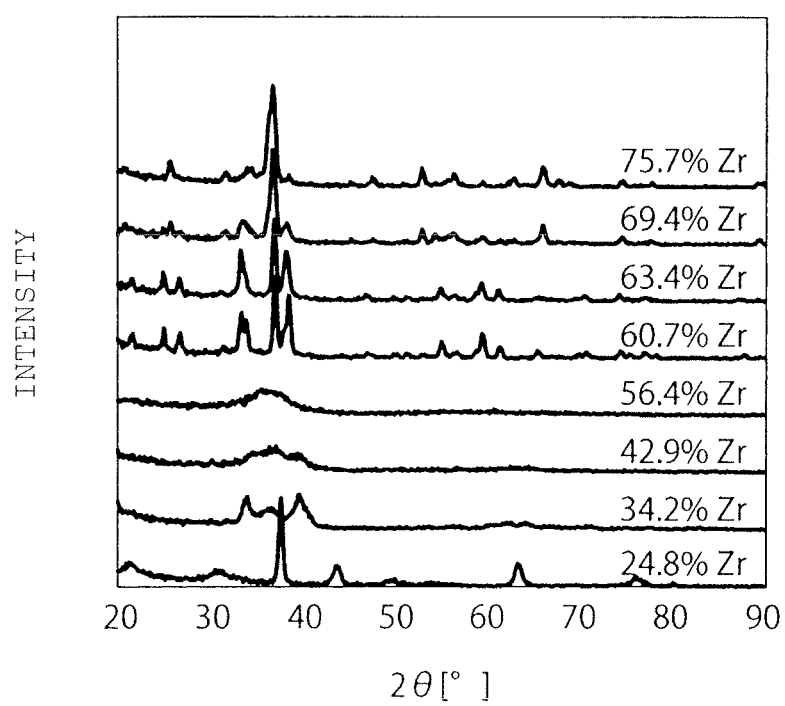
FIG. 14 is a graph of results of X-ray scattering measurement with respect to the metal mask layer according to the first embodiment.

FIG. 14 is a graph of results of X-ray scattering measurement with respect to the metal mask layer 6 according to the first embodiment.

The horizontal axis and the vertical axis of FIG. 14 respectively represent a scattering angle and an intensity of the X-ray. FIG. 14 illustrates results (curves) of X-ray scattering measurement with respect to the $Al_{1-X}Zr_X$ layer when X=24.8%, X=34.2%, X=42.9%, X=56.4%, X=60.7%, X=63.4%, X=69.4%, and X=75.7% in a similar manner to FIGS. 6 to 13. It is noted that the eight curves in FIG. 14 are displaced from one another in a direction of the vertical axis to make these curves easier to see.

FIG. 14 illustrates the results of X-ray scattering measurement with respect to the metal mask layer 6 formed in the step illustrated in FIG. 1 and thereafter annealed at 650° C. Referring to FIG. 14, the curves when X=42.9% and X=56.4% have no sharp peaks. This indicates that the $Al_{1-X}Zr_X$ layer when X=42.9% and the $Al_{1-X}Zr_X$ layer when X=56.4% are in an amorphous phase or a microcrystalline phase even after annealed. The curve when X=34.2% exhibits only low peaks, and the curve when X=60.7% exhibits peaks each divided into a plurality of peak portions. These results support the conclusion obtained from the images in FIGS. 6 to 13.

Figure 15:
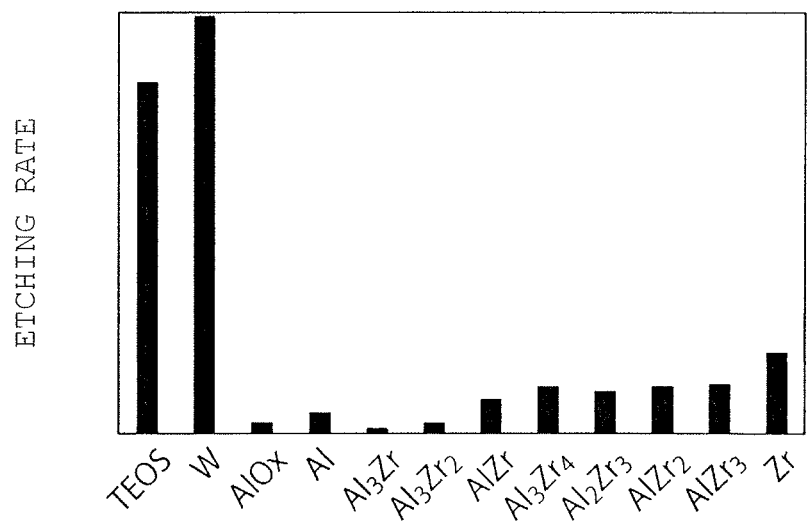
FIG. 15 is a graph of etching rates of the metal mask layer according to the first embodiment.

FIG. 15 is a graph of etching rates of the metal mask layer 6 according to the first embodiment.

FIG. 15 illustrates etching rates of the metal mask layer 6 when various metal layers are used as the metal mask layer 6. For comparison, FIG. 15 also illustrates an etching rate when the metal mask layer 6 is replaced with a tetraethyl orthosilicate (TEOS) film. FIG. 15 illustrates etching rates when the electrode layers 3 are etched using the metal mask layer 6 as an etching mask and using fluorine-based gas as etching gas.

FIG. 15 illustrates etching rates when a composition ratio of Al and Zr in the AlZr layer is changed to various values.

It can be understood from FIG. 15 that etching rates of an Al$_3$Zr layer and an Al$_3$Zr$_2$ layer are as low as an etching rate of AlO$_X$ (X is a positive integer). This indicates that the Al$_3$Zr layer and the Al$_3$Zr$_2$ layer are suitable as etching masks. When the Al$_3$Zr$_2$ layer is expressed in the form of the "Al$_{1-X}$Zr$_X$ layer", a value of X is 40%. Consequently, according to the results in FIG. 15, the value of X of the Al$_{1-X}$Zr$_X$ layer according to this embodiment is desirably 40% or less.

Figure 16:
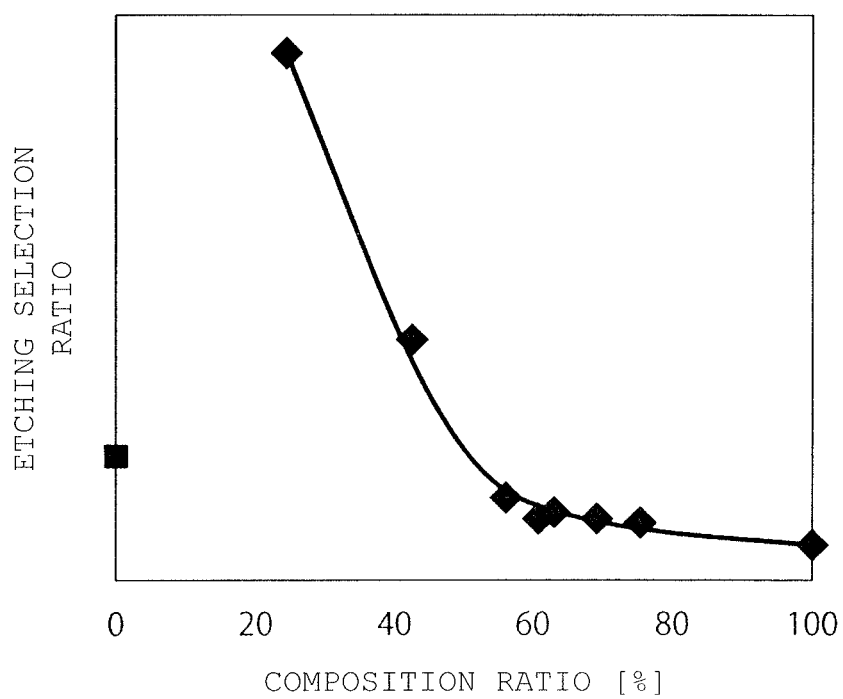
FIG. 16 is a graph of etching selection ratios of the metal mask layer according to the first embodiment.

FIG. 16 is a graph of etching selection ratios of the metal mask layer 6 according to the first embodiment.

The horizontal axis of FIG. 16 represents a composition ratio of Zr to Al and Zr in the Al$_{1-X}$Zr$_X$ layer (i.e., the metal mask layer 6), that is, a value of X. The vertical axis of FIG. 16 represents an etching selection ratio of the Al$_{1-X}$Zr$_X$ layer with respect to the electrode layers 3.

Referring to FIG. 16, as the value of X increases, the etching selection ratio decreases. The result in FIG. 16 supports the results in FIG. 15. That is, according to the results in FIGS. 15 and 16, the value of X of the Al$_{1-X}$Zr$_X$ layer according to this embodiment is desirably 40% or less.

Figure 17:
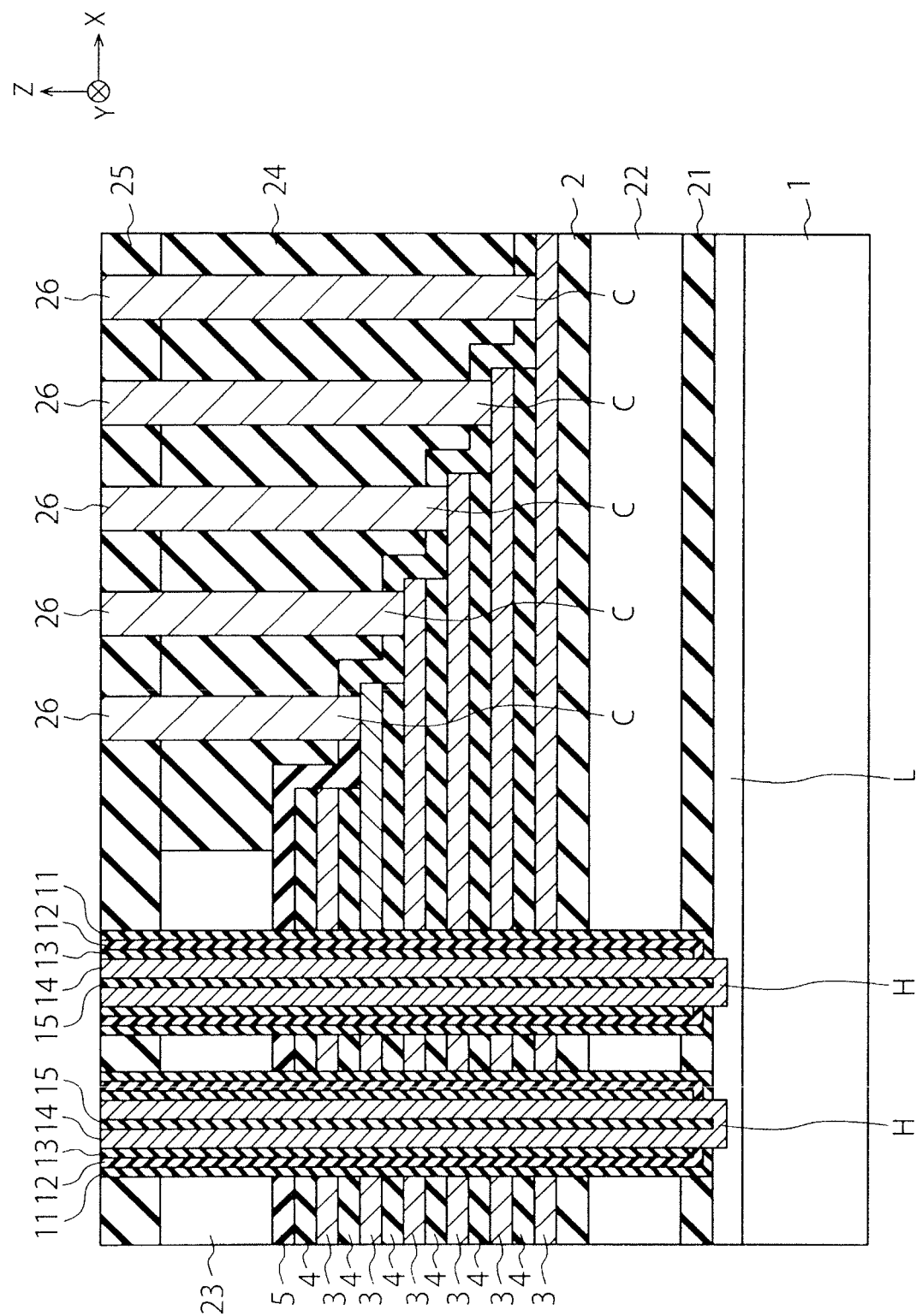
FIG. 17 is a cross-sectional view of the semiconductor device according to the first embodiment, illustrating a configuration thereof.

FIG. 17 is a cross-sectional view of the semiconductor device according to the first embodiment, illustrating a configuration thereof. FIG. 17 illustrates an example of the semiconductor device manufactured by the method according to this embodiment. FIG. 17 illustrates a memory cell portion and a stepped contact portion of a three-dimensional memory.

Referring to FIG. 17, the lower insulating film 2 is formed over the substrate 1 with another lower insulating film 21 and a source-side conductive layer (selection gate) 22 interposed between the lower insulating film 2 and the substrate 1. The lower insulating film 21 is, for example, an SiO$_2$ film. Examples of the source-side conductive layer 22 include a semiconductor layer such as a polysilicon layer, a metal layer such as a W layer, and a stacked film including a semiconductor layer and a metal layer.

The semiconductor device in FIG. 17 further includes a drain-side conductive layer (selection gate) 23, a first interlayer insulating film 24, a second interlayer insulating film 25, and a plurality of contact plugs 26. The drain-side conductive layer 23 and the first interlayer insulating film 24 are formed on the upper insulating film 5. The second interlayer insulating film 25 is formed on the drain-side conductive layer 23 and the first interlayer insulating film 24. Each of the contact plugs 26 is formed in a contact hole C extending through the upper insulating film 5, the first interlayer insulating film 24, and the second interlayer insulating film 25, and is electrically connected to a corresponding one of the electrode layers 3. Examples of the drain-side conductive layer 23 include a semiconductor layer such as a polysilicon layer, a metal layer such as a W layer, and a stacked film including a semiconductor layer and a metal layer. The first interlayer insulating film 24 is, for example, an SiO$_2$ film. The second interlayer insulating film 25 is, for example, an SiO$_2$ film. Each of the contact plugs 26 is, for example, a stacked film including a barrier metal layer containing titanium (Ti) and a plug material layer containing tungsten (W).

The block insulating film 11, the charge storage layer 12, the tunnel insulating film 13, the channel semiconductor layer 14, and the core insulating film 15 are formed in sequence in the above-described opening (memory hole) H extending through the lower insulating film 21, the source-side conductive layer 22, the lower insulating film 2, the plurality of electrode layers 3, the plurality of insulating layers 4, the upper insulating film 5, the drain-side conductive layer 23, and the second interlayer insulating film 25. The channel semiconductor layer 14 is electrically connected to a diffusion layer L formed in the substrate 1.

As described above, according to this embodiment, the stacked film including the plurality of electrode layers 3 and the plurality of insulating layers 4 is etched using the metal mask layer 6 containing a metal element fluoride of which has a boiling point of 800° C. or higher and chloride of which has a boiling point of 500° C. or less. As such a metal element, the metal mask layer 6 according to this embodiment contains two or more kinds of metal elements different from each other, for example, aluminum (Al) and zirconium (Zr). Thus, this embodiment can improve performance of the metal mask layer 6 used as an etching mask.

Although the metal mask layer 6 according to this embodiment is used as an etching mask to form the opening H in the stacked film including the plurality of electrode layers 3 and the plurality of insulating layers 4, the metal mask layer 6 may be used as etching masks for other purposes. For example, the metal mask layer 6 may be used as an etching mask to form the contact holes C in FIG. 17. Desirably, the metal mask layer 6 is used, for example, as etching masks to form a hole of a high aspect ratio and a deep recess and to etch a metal layer.

The metal mask layer 6 according to this embodiment may contain a combination of metal elements other than Al and Zr. For example, the metal mask layer 6 according to this embodiment may contain Bi or Ga or Hf in place of Zr. The metal mask layer 6 according to this embodiment may contain an element other than metal elements. For example, the metal mask layer 6 may contain a combination including Al, Zr, and nitrogen (N) or a combination including Al, Zr, and oxygen (O). The metal mask layer 6 containing N or O has an advantage, for example, that heat resistance of the metal mask layer 6 can be improved.

The stacked film including the plurality of electrode layers 3 and the plurality of insulating layers 4 may be etched in any apparatus. An example of the apparatus is an inductively coupled (parallel-plate) plasma generation RIE apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   forming a first film on a substrate;
   forming a second film on the first film, the second film including fluoride of a first metal element having a first boiling point of 800° C. or higher and fluoride of a second metal element having a second boiling point of 800° C. or higher, the second metal element being different from the first metal element; and
   etching the first film using the second film as an etching mask and etching gas that includes fluorine.

2. The method according to claim 1,
wherein chloride of the first metal element has a third boiling point of 500° C. or less and chloride of the second metal element has a fourth boiling point of 500° C. or less,
the method further comprising etching the second film using the etching gas prior to etching the first film.

3. The method according to claim 1,
wherein the second boiling point of the fluoride of the second metal element is lower than the first boiling point of the fluoride of the first metal element, and
wherein a composition ratio of the second metal element to the first metal element and the second metal element in the second film is 25% or higher and 63% or less.

4. The method according to claim 1,
wherein the second boiling point of the fluoride of the second metal element is lower than the first boiling point of the fluoride of the first metal element, and
wherein a fourth boiling point of the chloride of the second metal element is higher than a third boiling point of the chloride of the first metal element.

5. The method according to claim 1, wherein the first metal element is aluminum.

6. The method according to claim 1, wherein the second metal element is at least one of: zirconium, bismuth, gallium, or hafnium.

7. The method according to claim 1, wherein the second film comprises the first metal element, the second metal element, and at least one of nitrogen or oxygen.

8. The method according to claim 1, wherein the second film is formed as an amorphous layer comprising the first metal element and the second metal element.

9. The method according to claim 1, wherein the first film includes a plurality of metal layers and a plurality of insulating layers, the metal layers and the insulating layers alternately stacked on top of one another.

10. The method according to claim 9, wherein each of the metal layers includes tungsten.

11. The method according to claim 1,
wherein the first boiling point is higher than the second boiling point, and
wherein the third boiling point is less than the fourth boiling point.

12. The method according to claim 1, wherein the first metal element includes Al.

13. The method according to claim 1, wherein the second metal element includes Zr.

14. The method according to claim 1, wherein the etching gas includes at least one of chlorine-based gas or fluoride-based gas in a reactive ion etching (RIE) process.

* * * * *